United States Patent
Koizumi et al.

(10) Patent No.: US 7,963,031 B2
(45) Date of Patent: Jun. 21, 2011

(54) PACKAGE FOR SEMICONDUCTOR DEVICE AND METHOD OF MANUFACTURING THE SAME

(75) Inventors: Naoyuki Koizumi, Nagano (JP); Kiyoshi Oi, Nagano (JP); Akihiko Tateiwa, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 12/330,924

(22) Filed: Dec. 9, 2008

(65) Prior Publication Data

US 2009/0151995 A1    Jun. 18, 2009

(30) Foreign Application Priority Data

Dec. 13, 2007 (JP) .................................. 2007-322337

(51) Int. Cl.
    *H01R 43/00* (2006.01)
(52) U.S. Cl. ............... 29/854; 29/831; 29/830; 29/842; 29/846; 361/794; 361/786; 174/368; 174/109
(58) Field of Classification Search .................. 361/794, 361/786, 301.1; 174/368, 660, 109, 355; 29/831, 830, 842, 846
    See application file for complete search history.

(56) References Cited

U.S. PATENT DOCUMENTS

| | | | | |
|---|---|---|---|---|
| 6,297,968 B1 * | 10/2001 | Nakai | ......................... | 361/803 |
| 6,580,036 B2 * | 6/2003 | Kim et al. | ....................... | 174/261 |
| 6,683,781 B2 * | 1/2004 | Ho et al. | ..................... | 361/301.1 |
| 6,767,616 B2 * | 7/2004 | Ooi et al. | ....................... | 428/209 |
| 6,855,177 B2 * | 2/2005 | Fujii et al. | ..................... | 29/25.03 |
| 7,271,348 B1 * | 9/2007 | Fan et al. | ....................... | 174/260 |
| 2002/0195700 A1 * | 12/2002 | Li | ................................ | 257/700 |
| 2005/0067713 A1 * | 3/2005 | Mutta et al. | .................... | 257/774 |
| 2006/0214277 A1 * | 9/2006 | Saeki | ............................. | 257/684 |
| 2006/0215380 A1 * | 9/2006 | Lu et al. | ......................... | 361/763 |
| 2006/0283547 A1 * | 12/2006 | Yuri et al. | .................. | 156/308.6 |
| 2007/0211403 A1 * | 9/2007 | Sievenpiper et al. | ....... | 361/301.1 |
| 2008/0171441 A1 * | 7/2008 | Takemiya | ..................... | 438/693 |

FOREIGN PATENT DOCUMENTS

JP          11-68319          3/1999

* cited by examiner

*Primary Examiner* — Tuan T Dinh
*Assistant Examiner* — Steve Sawyer
(74) *Attorney, Agent, or Firm* — Rankin, Hill & Clark LLP

(57) ABSTRACT

In a package for a semiconductor device, a core substrate has two metal plates, each of which includes a first through hole, a second through hole, a projection, and an insulating layer formed on its surface. The metal plates are stacked in a manner that the projections of the mutual metal plates enter the second through hole of the metal plate on a partner side, and the first through holes of the metal plates form a through hole penetrating the core substrate. A tip end of each of the projections of the metal plates is exposed to a surface of the metal plate on the partner side to form a first terminal portion, and a second terminal portion is exposed from the insulating layer and formed on a surface of the metal plate on a side where the first terminal portion of the metal plate on the partner side is exposed.

5 Claims, 4 Drawing Sheets

PACKAGE FOR SEMICONDUCTOR DEVICE AND METHOD OF MANUFACTURING THE SAME

TECHNICAL FIELD

The present disclosure relates to a package for a semiconductor device and a method of manufacturing the package for a semiconductor device.

RELATED ART

Referring to a so-called buildup wiring board (a package for a semiconductor device), a through hole is formed on a core substrate (a glass epoxy resin substrate), to both surfaces of which coppers are laminated, by means of a drill, electroless copper plating and electrolytic copper plating are carried out to the core substrate, an etching processing is carried out to form wiring patterns to be electrically connected by a through hole plating coating (a conducting portion) on the both surfaces of the core substrate, and furthermore, a multi-layered wiring pattern is formed by a buildup method (Patent Document 1).

[Patent Document 1] Japanese Patent Unexamined Publication No. 11-68319

However, the related-art package for a semiconductor device has the following problems.

More specifically, it is necessary to form through holes one by one on a core substrate obtained by impregnating a glass fiber with an epoxy resin by using a drill. For this reason, there is a problem in that a long time is required for a processing and a cost is increased. In the case in which the hole is formed by means of the drill, moreover, a hole diameter and a pitch of the through hole cannot be reduced. Therefore, there is a problem in that a wiring density cannot be increased.

In many cases, furthermore, a power layer and a ground layer are provided as inner layers. They are formed by an electrolytic plated film. For this reason, there is a problem in that it is hard to increase a thickness and a resistance value is increased.

SUMMARY

Exemplary embodiments of the present invention provide a package for a semiconductor device in which a high density wiring can be carried out and a resistance value can be reduced, and a method of manufacturing the package for a semiconductor device An exemplary embodiment of the present invention provides a package for a semiconductor device, comprising:

a core substrate having two metal plates, each metal plate including a first through hole, a second through hole, a projection, and an insulating layer formed on its surface, the two metal plates being stacked in a manner that the projections of the mutual metal plates enter the second through hole of the metal plate on a partner side, and the first through holes of the metal plates form a through hole penetrating the core substrate;

a conducting portion formed on the through hole penetrating the core substrate; and wiring patterns formed on both surfaces of the core substrate and electrically connected to each other through the conducting portion, wherein a tip end of each of the projections of the metal plates is exposed to a surface of the metal plate on the partner side to form a first terminal portion, and a second terminal portion is exposed from the insulating layer and formed on a surface of the metal plate on a side where the first terminal portion of the metal plate on the partner side is exposed.

One of the two metal plates is a power layer and the other is a ground layer.

The insulating layer is formed by electrodeposition.

The first terminal portion and the second terminal portion on a side of one of the surfaces of the core substrate are formed to be external connecting terminals.

In addition, a bump is formed on the external connecting terminal.

Moreover, an exemplary embodiment of the present invention provides a method of manufacturing a package for a semiconductor device comprising the steps of:

forming a core substrate by stacking two metal plates, each of which includes a first through hole, a second through hole, a projection, and an insulating layer formed on its surface, in a manner that the projections of the mutual metal plates enter the second through hole of the metal plate on a partner side, and the first through holes of the metal plates form a through hole penetrating the core substrate;

forming a first terminal portion by exposing a tip end of each of the projections of the metal plates to a surface of the metal plate on the partner side;

forming a second terminal portion by exposing from the insulating layer on a surface of the metal plate on a side where the first terminal portion of the metal plate on the partner side is exposed;

forming a conducting portion on the through hole penetrating the core substrate; and forming wiring patterns to be electrically connected through the conducting portion on both surfaces of the core substrate.

The first through holes, the second through holes and the projections of the two metal plates are formed by carrying out an etching processing over the metal plates.

The first through holes, the second through holes and the projections of the two metal plates are formed by carrying out a press processing over the metal plates.

Furthermore, the projection is formed by carrying out a cut-up processing over the metal plate.

Moreover, the second terminal portion is formed by carrying out a grinding processing over a convex portion provided on the metal plate to remove the insulating layer.

According to the invention, the hole can be formed on the metal plate through the press processing or the etching processing in place of a drill. Therefore, the through hole can be set to have a small diameter and a small pitch. Accordingly, a high density wiring can be carried out. By using a metal plate having a predetermined thickness, moreover, it is possible to provide a package for a semiconductor device which is excellent in a strength and can have a resistance value reduced.

Other features and advantages may be apparent from the following detailed description, the accompanying drawings and the claims.

DETAILED DESCRIPTION

The best embodiments according to the invention will be described below in detail with reference to the accompanying drawings.

Figure 1:
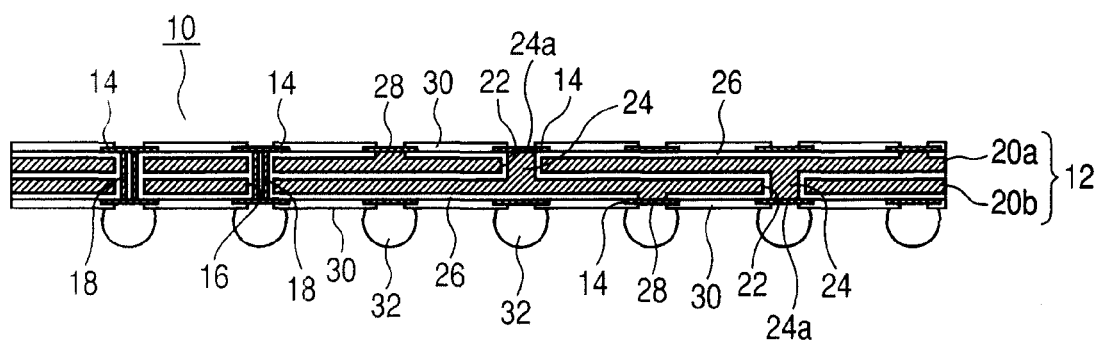
FIG. 1 is a sectional view showing a package for a semiconductor device according to the embodiment.

FIG. 1 is a sectional view showing a package 10 for a semiconductor device according to the embodiment.

The package 10 for a semiconductor device has a structure in which wiring patterns 14 are formed on a front surface and a back surface of a core substrate 12 and is connected electrically through a conducting portion 18 formed on a through hole 16 penetrating the core substrate 12.

The core substrate 12 is formed by integrally providing the first through hole 16 for the conducting portion 18, a second through hole 22 and a projection 24 in each of two metal plates 20a and 20b, forming an insulating layer 26 on surfaces of each of the two metal plates 20a and 20b, and stacking the two metal plates 20a and 20b in such a manner that the projections 24 of the mutual metal plates 20a and 20b enter the second through hole 22 of the metal plate on a partner side. That is, the projection 24 of the metal plate 20a enters the second through hole 22 of the metal plate 20b, and the projection 24 of the metal plate 20b enters the second through hole 22 of the metal plate 20a. The insulating layer 26 is formed by carrying out an electrodeposition over a resin. The insulating layer 26 may be formed by another means such as coating in place of the electrodeposition. A thickness of the insulating layer 26 is not particularly restricted.

The insulating layer 26 on a tip end of the projection 24 is removed and the tip end of the projection 24 is exposed to the surface of the metal plate on the partner side so that a first terminal portion 24a is formed, and a second terminal portion 28 exposed from the insulating layer 26 is formed in a predetermined portion on a surface of the metal plate on a side where the first terminal portion 24a of the metal plate on the partner side is exposed. That is, the insulating layer 26 on a tip end of the projection 24 of the metal plate 20a is removed and the tip end of the projection 24 is exposed to the surface of the metal plate 20b so that a first terminal portion 24a is formed, and a second terminal portion 28 exposed from the insulating layer 26 is formed in a predetermined portion on a surface of the metal plate 20b on a side where the first terminal portion 24a of the metal plate 20a is exposed. The insulating layer 26 on a tip end of the projection 24 of the metal plate 20b is removed and the tip end of the projection 24 is exposed to the surface of the metal plate 20a so that a first terminal portion 24a is formed, and a second terminal portion 28 exposed from the insulating layer 26 is formed in a predetermined portion on a surface of the metal plate 20a on a side where the first terminal portion 24a of the metal plate 20b is exposed.

Electroless copper plating and electrolytic copper plating are sequentially carried out over the conducting portion 18, the insulating layer 26, the first terminal portion 24a and the second terminal portion 28 to form a copper plated film. The copper plated film is subjected to an etching processing to form the wiring pattern 14.

An insulating layer (a solder resist layer in the embodiment) 30 is formed on the wiring pattern 14, and a part of the insulating layer 30 is opened to expose the wiring pattern 14 so that a pad is formed.

Although a wiring pattern itself for a first layer is formed as the pad in the embodiment, it is a matter of course that the wiring pattern may be formed to be multilayered by a buildup method.

An external connecting bump 32 is formed on the pad at a lower surface side so that the package 10 for a semiconductor device is finished.

It is also possible to obtain a package for a semiconductor device of a PGA type by bonding a pin (not shown) in place of the bump 32. In FIG. 2J, moreover, it is also possible to use a package for a semiconductor device of an LGA type in which neither a bump nor a pin is attached.

By flip-chip connecting a semiconductor chip (not shown) to the pad 14 on an upper surface side and filling an underfill resin (not shown) between the semiconductor chip and an upper surface of the package, it is possible to obtain a semiconductor device.

It is possible to use one of the two metal plates 20a and 20b as a power layer and the other as a ground layer.

For the metal plates 20a and 20b, optional thicknesses can be selected. By using a metal plate having a thickness of approximately 200 μm, for example, it is also possible to obtain a great strength and to decrease a resistance value, which is suitable.

Moreover, since the metal plate is used for the core substrate, various hole forming processings can also be carried out easily with a small diameter and a small pitch through a press processing or an etching processing. Consequently, a high density wiring can be carried out. For example, the hole diameters of the first through hole 16 and the second through hole 22 is approximately 50 μm to 700 μm and a pitch between the holes is approximately equal to or more than 100 μm.

Materials of the metal plates 20a and 20b are not particularly restricted but a 42 alloy (an FeNi alloy) or a copper alloy material can be used.

Further, for example, the diameter of the projection 24 is approximately 40 μm to 500 μm, a pitch between the projections 24 is approximately equal to or more than 100 μm, and the thickness of the insulating layer 26 is approximately 5 μm to 100 μm.

Next, an example of a manufacturing method will be described.

FIGS. 2A to 2J are views showing a process for forming the core substrate 12 through an etching processing and assembling the package 10 for a semiconductor device.

Figure 2A:
FIGS. 2A to 2J are views showing a process in the case in which the package for a semiconductor device in FIG. 1 is formed through an etching processing.
Figure 2B:

First of all, one surface (front surface) of a metal plate 20 (FIG. 2A) is subjected to the etching processing to form a convex portion 34 (FIG. 2B).

Although the etching processing is carried out by photolithography and a processing of forming and removing a resist pattern serving as a mask are required, description will be omitted (subsequent steps are the same).

Figure 2C:
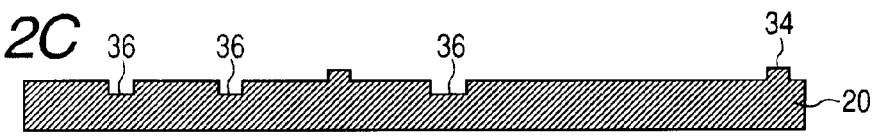

Next, a hole 36 is formed by etching in portions to be a first through hole 16 and a second through hole 22 on the same one surface side of the metal plate 20 (FIG. 2C).

Figure 2D:
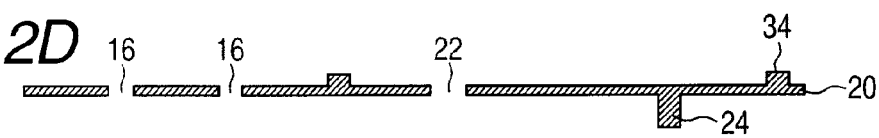

Then, a back surface side is subjected to half etching to cause the hole 36 to penetrate, thereby forming the first through hole 16 and the second through hole 22 and forming a projection 24 (FIG. 2D).

Figure 6A:
FIGS. 6A to 6D are views showing a modified process in the case in which the package for a semiconductor device in FIG. 1 is formed.
Figure 6B:
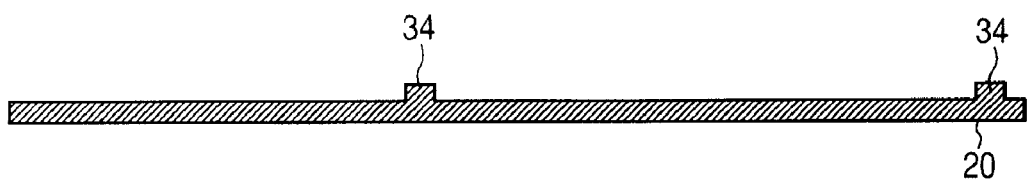
Figure 6C:
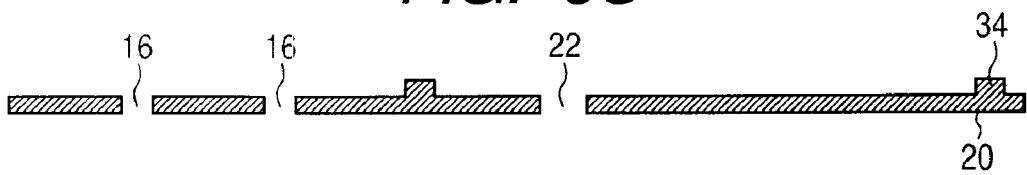
Figure 6D:
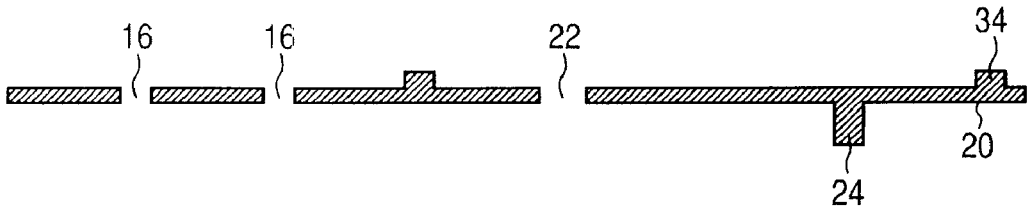

In the embodiment, although the projection 24 is formed by etching, it is possible to form the first through hole 16 and the second through hole 22 in the metal plate 20 in which the convex portion 34 is formed (FIGS. 6B and 6C) and then form the projection 24 on the metal plate 20 (See FIG. 6D) by electrolytic plating or conductive paste via a mask. In the case where the projections 24 are formed by electrolytic plating, it is preferable to perform a process for aligning the height of the projections, for example, CMP (Chemical Mechanical Polish), after electrolytic plating.

Thereafter, an insulating layer 26 is formed on the metal plate 20 through an electrodeposition. The insulating layer 26 is also formed in the first through hole 16, in the second through hole 22, on the convex portion 34 and on the projection 24.

Figure 2E:
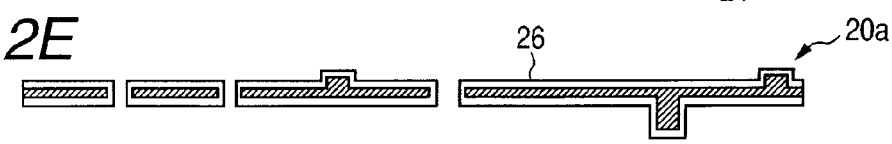

Thus, a metal plate 20a is formed (FIG. 2E).

Figure 2F:

By the same steps, the metal plate is subjected to the etching processing to form a metal plate 20b (FIG. 2F). The first through hole 16, the second through hole 22, the convex portion 34 and the projection 24 are also formed in the metal plate 20b. The insulating layer 26 is formed on the metal plate 20 through an electrodeposition and also formed in the first through hole 16, in the second through hole 22, on the convex portion 34 and on the projection 24.

Figure 2G:
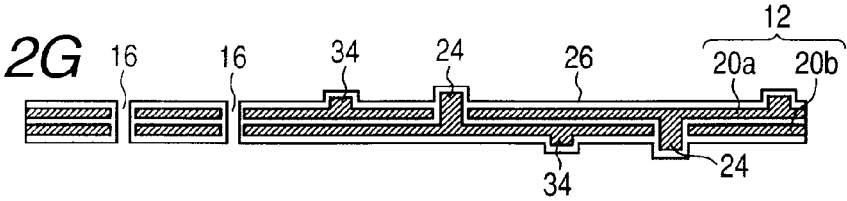

As shown in FIG. 2G, next, the two metal plates 20a and 20b are stacked in such a manner that the projections 24 of the mutual metal plates 20a and 20b enter the second through hole 22 of the metal plate on a partner side, and the core substrate 12 is thus formed.

While the two metal plates 20a and 20b may be specially bonded and integrated with an adhesive, it is also possible to bond the metal plates 20a and 20b through the insulating layer 26 and cure the insulating layer 26 to integrate the metal plates 20a and 20b by using a resin having an adhesiveness for the insulating layer 26.

Figure 2H:
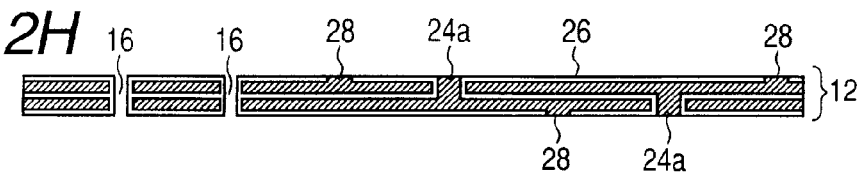
Figure 3:
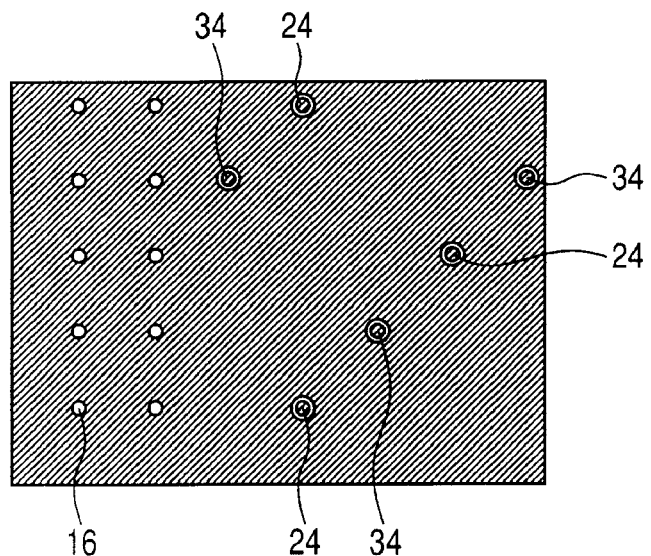
FIG. 3 is a plan view showing an example of an arrangement of a first through hole, a projection and a convex portion.

Subsequently, the insulating layer 26 provided on a surface of a tip end of the projection 24 is ground and removed, and the tip end of the projection 24 is exposed to a surface of the metal plate on the partner side to form a first terminal portion 24a. The insulating layer 26 on a surface of a tip end of the convex portion 34 is ground and removed to form a second terminal portion 28 exposed from the insulating layer 26 on the surfaces of the metal plates 22a and 22b on a side where the first terminal portion 24a of the metal plate on the partner side is exposed (FIG. 2H). FIG. 3 is a plan view showing positions of the first through hole 16, the projection 24 and the convex portion 34 in a state in which the two metal plates 20a and 20b are stacked. It is a matter of course that an arrangement of the first through hole 16, the projection 24 and the convex portion 34 is not restricted thereto.

Figure 2I:
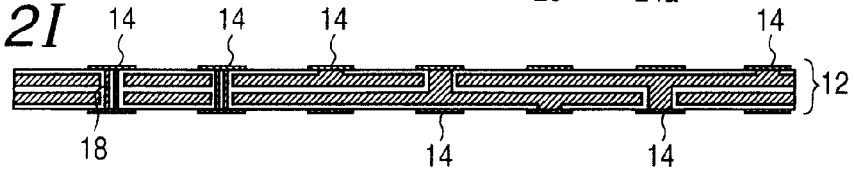
Figure 2J:
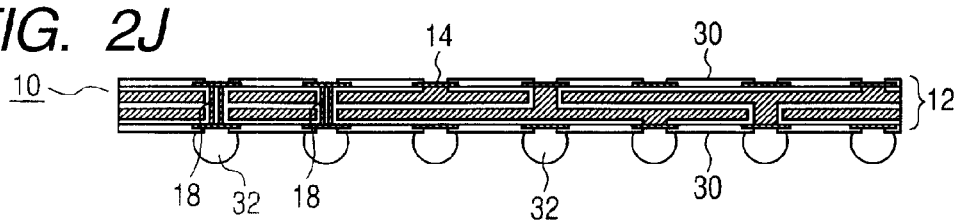

Next, electroless copper plating and electrolytic copper plating are sequentially carried out to form a conducting portion 18 in the first through hole 16, and a copper plated film is formed on a front surface and a back surface of the core substrate 12 and is subjected to etching to form a wiring pattern (pad) 14 (FIG. 2I).

Subsequently, the wiring pattern 14 is covered to form an insulating layer (a solder resist layer) 30, and an exposure and a development are carried out to expose the pad 14.

A bump 32 to be an external connecting terminal is formed on one of surface sides so that the package 10 for a semiconductor device can be finished.

Although the wiring pattern 14 having one layer is formed on both sides of the core substrate, it is possible to properly form a wiring pattern having a plurality of layers by a buildup method.

Figure 4:
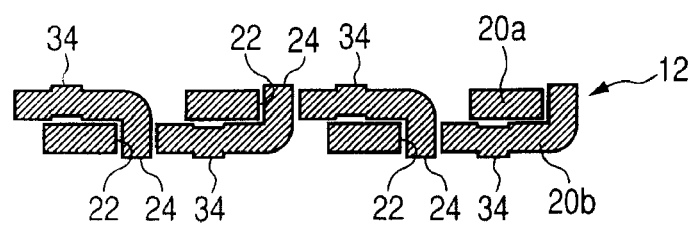
FIG. 4 is a partial explanatory view showing a state in which two metal plates are formed by a press processing and are stacked and formed into a core substrate.

FIG. 4 is a partial explanatory view showing an embodiment in which two metal plates 20a and 20b are formed by a press processing and stacked, illustrating a state in which projections 24 of the mutual metal plates 20a and 20b enter second through holes 22 of the metal plates 20a and 20b on the partner side.

In the embodiment, a first through hole 16 (not shown) and a second through hole 22 can easily be formed on each of the metal plates 20a and 20b by means of a punch. Moreover, a convex portion 34 is formed to be swollen toward an opposite side by pushing up the metal plate from a back side. In the embodiment, moreover, the projection 24 is formed by cutting up the metal plate in an opposite direction to the convex portion 34. A hole generated by cutting up the metal plate may be buried with an insulating layer 26 covering the metal plate (not shown).

After the metal plates 20a and 20b formed as described above are stacked as shown in FIG. 4 to form a core substrate 12, a package 10 for a semiconductor device can be formed through the same steps as those in FIGS. 2G to 2J.

Also in the embodiment, an arrangement of the first through hole 16, the second through hole 22, the projection 24 and the convex portion 34 is optional.

Figure 5:
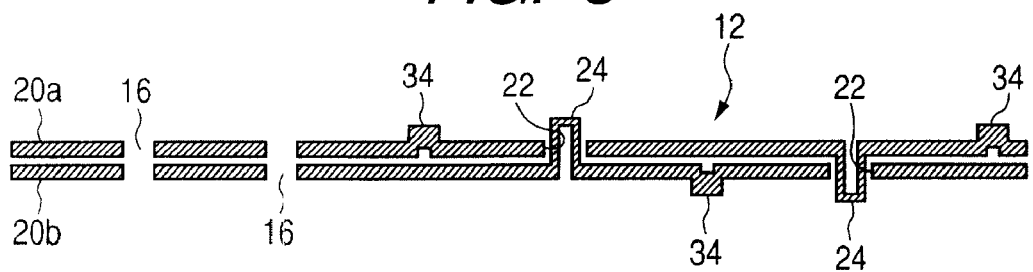
FIG. 5 is an explanatory view showing a further embodiment, illustrating a state in which two metal plates are formed by a press processing and are stacked and formed into a core substrate.

FIG. 5 is an explanatory view showing a further embodiment in which two metal plates 20a and 20b are formed by a press processing and stacked, illustrating a state in which projections 24 of the mutual metal plates 20a and 20b enter second through holes 22 of the metal plates 20a and 20b on a partner side.

In the embodiment, both of the projection 24 and a convex portion 34 are formed by a method of pushing up the metal plate from a back side. In FIG. 5, an insulating layer 26 is not shown.

The metal plates 20a and 20b formed as described above are stacked to form a core substrate 12 as shown in FIG. 5, and a package 10 for a semiconductor device can be formed through the same steps as those in FIGS. 2G to 2J.

Also in the embodiment, an arrangement of a first through hole 16, a second through hole 22, the projection 24 and the convex portion 34 is optional.

In each of the embodiments, it is also possible to form a second terminal portion 28 in the convex portion 34 by simply removing the insulating layer 26 through etching and directly exposing the metal plate without forming the convex portion 34 (not shown).

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of manufacturing a package for a semiconductor device, comprising the steps of:
   preparing a first metal plate and a second metal plate, whereby each metal plate includes a first through hole, a second through hole, a projection extending from one side of the metal plate, a convex portion extending from the other side of the metal plate, and an insulating layer formed on a surface of each metal plate;
   forming a core substrate by stacking the first metal plate and the second metal plate while entering the projection of the first metal plate into the second through hole of the second metal plate and entering the projection of the second metal plate into the second through hole of the first metal plate, and forming a through hole penetrating the core substrate by the first through holes of the first metal plate and the second metal plate;

forming a first terminal portion and a second terminal portion by exposing a tip end of the projection from the first metal plate and a tip end of the convex portion from the second metal plate respectively on a same surface of the second metal plate such that the tip end of the projection and the tip end of the convex portion are flush with the insulating layer;

forming a first terminal portion and a second terminal portion by exposing a tip end of the projection from the second metal plate and a tip end of the convex portion from the first metal plate respectively on a same surface of the first metal plate such that the tip end of the projection and the tip end of the convex portion are flush with the insulating layer;

forming a conducting portion on the through hole penetrating the core substrate; and forming wiring patterns to be electrically connected through the conducting portion on both surfaces of the core substrate.

2. The method of manufacturing a package for a semiconductor device according to claim 1, wherein the first through holes, the second through holes and the projections of the first metal plate and the second metal plate are formed by carrying out an etching processing over the metal plates.

3. The method of manufacturing a package for a semiconductor device according to claim 1, wherein the first through holes, the second through holes and the projections of the first metal plate and the second metal plate are formed by carrying out a press processing over the metal plates.

4. The method of manufacturing a package for a semiconductor device according to claim 1, wherein the second terminal portion is formed by carrying out a grinding processing over the convex portion provided on the first metal plate and the second metal plate to remove the insulating layer.

5. The method of manufacturing a package for a semiconductor device according to claim 3, wherein the projection is formed by carrying out a cut-up processing over the first metal plate and the second metal plate.

* * * * *